(12) United States Patent
Lee

(10) Patent No.: US 10,147,658 B2
(45) Date of Patent: Dec. 4, 2018

(54) STACKED SEMICONDUCTOR APPARATUS BEING ELECTRICALLY CONNECTED THROUGH THROUGH-VIA AND MONITORING METHOD

(71) Applicant: SK hynix Inc., Icheon-si, Gyeonggi-do (KR)

(72) Inventor: Sang Ho Lee, Icheon-si (KR)

(73) Assignee: SK hynix Inc., Incheon-si (KR)

( * ) Notice: Subject to any disclaimer, the term of this patent is extended or adjusted under 35 U.S.C. 154(b) by 0 days.

(21) Appl. No.: 15/380,485

(22) Filed: Dec. 15, 2016

(65) Prior Publication Data

US 2017/0103930 A1    Apr. 13, 2017

Related U.S. Application Data

(63) Continuation-in-part of application No. 14/488,418, filed on Sep. 17, 2014, now Pat. No. 9,559,677.

(30) Foreign Application Priority Data

Jun. 9, 2014   (KR) .................. 10-2014-0069442

(51) Int. Cl.
*H01L 23/48*    (2006.01)
*H01L 21/66*    (2006.01)
(Continued)

(52) U.S. Cl.
CPC .......... *H01L 22/34* (2013.01); *G01R 31/2601* (2013.01); *G01R 31/2837* (2013.01);
(Continued)

(58) Field of Classification Search
CPC ...... G01R 31/2601; H01L 2225/06541; H01L 25/0657
See application file for complete search history.

(56) References Cited

U.S. PATENT DOCUMENTS

2008/0204091 A1    8/2008  Choo et al.
2010/0182046 A1    7/2010  Otsuga et al.
(Continued)

FOREIGN PATENT DOCUMENTS

KR    1020110002281 A    1/2011

*Primary Examiner* — Joseph Galvin, III
(74) *Attorney, Agent, or Firm* — William Park & Associates Ltd.

(57) ABSTRACT

A semiconductor apparatus includes a plurality of stacked chips. Each of the plurality of stacked chips includes a delay chain. Each of the plurality of stacked chips comprises a plurality of Through-Vias, wherein one of the plurality of Through-Vias formed in a first one of the plurality of stacked chips and electrically coupled to a predetermined location of a first delay chain on the first one of the plurality of stacked chips and one of the plurality of Through-Vias formed in a neighboring one of the plurality of stacked chips and electrically coupled to a predetermined location of a delay chain on the neighboring one of the plurality of stacked chips are configured to electrically couple the first one of the plurality of stacked chips to the neighboring one of the plurality of stacked chips. A signal transmitted from a first one of the plurality of stacked chips generates a feedback signal to the first one of the plurality of stacked chips through one or more of the plurality of Through-Vias.

12 Claims, 6 Drawing Sheets

(51) Int. Cl.
    *H01L 25/065*   (2006.01)
    *G01R 31/26*    (2014.01)
    *G01R 31/28*    (2006.01)
    *H03K 5/159*    (2006.01)

(52) U.S. Cl.
    CPC ......... *H01L 25/0657* (2013.01); *H03K 5/159* (2013.01); *H01L 22/14* (2013.01); *H01L 23/481* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06596* (2013.01)

(56) References Cited

U.S. PATENT DOCUMENTS

| | | | |
|---|---|---|---|
| 2013/0076387 A1 | 3/2013 | Ishikawa et al. | |
| 2013/0094272 A1* | 4/2013 | Riho .................. | G11C 11/4076 |
| | | | 365/63 |
| 2016/0020268 A1* | 1/2016 | Suwada ............ | H01L 23/49833 |
| | | | 257/532 |

* cited by examiner

STACKED SEMICONDUCTOR APPARATUS BEING ELECTRICALLY CONNECTED THROUGH THROUGH-VIA AND MONITORING METHOD

CROSS-REFERENCES TO RELATED APPLICATION

The present application claims priority under 35 U.S.C. § 119(a) to Korean application number 10-2014-0069442, filed on Jun. 9, 2014, in the Korean Intellectual Property Office, which is incorporated herein by reference in its entirety as set forth in full.

BACKGROUND

1. Technical Field

Various embodiments relate to a semiconductor apparatus, and more particularly, to a semiconductor apparatus that is stacked through a Through-Via.

2. Related Art

Recent technological advances directed towards attempts to increase the integrity of semiconductor apparatuses have led to the development of a 3 dimensional (3D) semiconductor apparatus where a plurality of chips are stacked and packaged in single package. The 3D semiconductor apparatus seeks to increase integrity in a relatively limited amount of space by vertically stacking two or more chips.

In one example of a 3D semiconductor apparatus, a plurality of substantially similar or different chips are stacked. The plurality of stacked chips are electrically coupled to each other through wires like metal lines.

In some cases, "Through Silicon Via" (TSV) are used to electrically couple the plurality of stacked chips. The TSV extends through the plurality of stacked chips. A semiconductor apparatus that uses a TSV structure that vertically extends through and electrically couples the plurality of chips typically has a relatively smaller size package than a semiconductor apparatus that uses a wire structure to electrically couple the plurality of chips through edge-wiring.

A Through Via such as the TSV is typically created by forming a hole that extends through the chip, forming a dielectric layer on the side wall of the hole, and filling a conducting material in the dielectric layer. The Through-Via is used as a pathway for transferring a signal and electrically couples the stacked chips.

SUMMARY

In an embodiment, a semiconductor apparatus may include an oscillating control portion disposed in a first chip, and configured to generate a transmission signal by receiving an input signal and a feedback signal, first and second Through-Vias configured to electrically couple the first chip and a second chip, a first delay portion disposed in the first chip, and coupled to the first and second Through-Vias, a second delay portion disposed in the second chip, and coupled to the first and second Through-Vias, and a first switching portion configured to electrically couple the first chip to the first and second Through-Vias based on a first switch control signal In an embodiment, a monitoring method of a semiconductor apparatus including a plurality of chips, wherein each of the plurality of chips has a plurality of Through-Vias, and is electrically coupled to another one of the plurality chips, the monitoring method may include defining a chip of the plurality of chips as a reference chip for a oscillating path, selecting a oscillating path passing through at least two of the plurality of Through-Vias disposed in at least two of the plurality of chips, and monitoring characteristics of the at least of the plurality of Through-Vias based on a signal transmitted through the oscillating path.

DETAILED DESCRIPTION

Various embodiment of a semiconductor apparatus will be described below with reference to the accompanying drawings.

Figure 1:
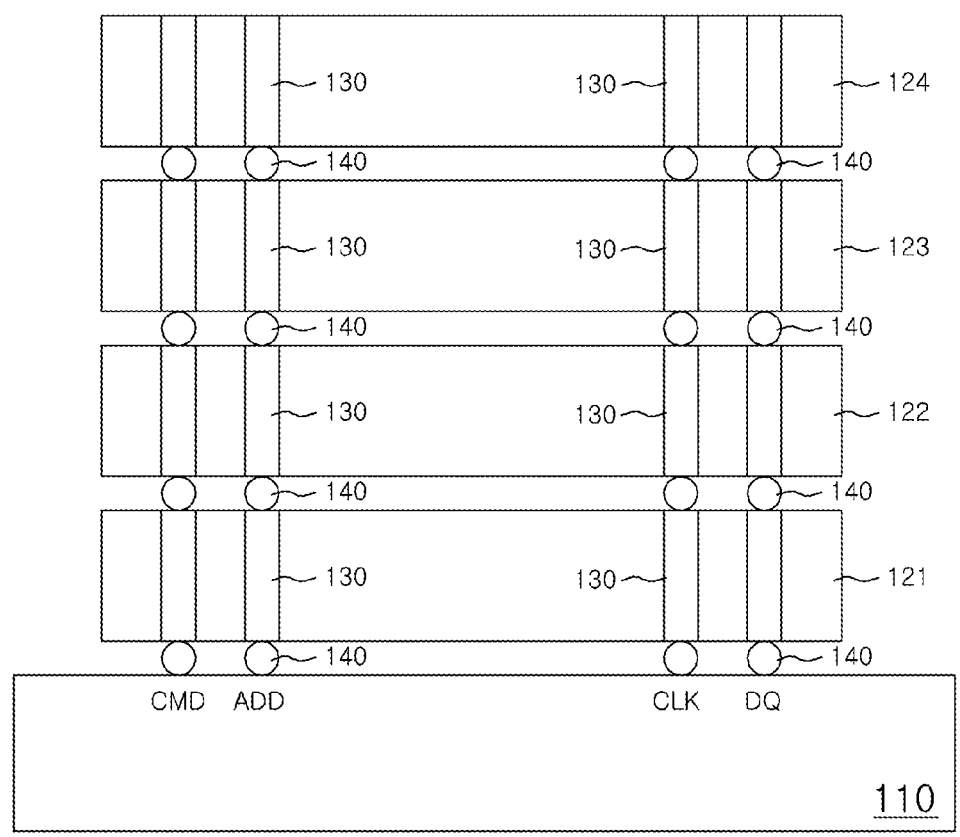
FIG. 1 is a schematic diagram representation of an embodiment of is semiconductor apparatus.

Referring to FIG. 1, an embodiment of a semiconductor apparatus 1 is configured to include a base chip 110 and a plurality of stacked chips 121-124. Each of the plurality of stacked chips 121-124 is configured to include a number of Through-Vias 130 formed therein. The Through-Vias 130 of the plurality of stacked chips 121-124 are configured to be electrically coupled to each other through bumps 140. The plurality of stacked chips 121-124 are configured to be electrically coupled to each other through the Through-Vias 130 and the bumps 140. While FIG. 1 shows four stacked chips 121-124, the semiconductor apparatus 1 may include a fewer or a greater number of stacked chips. In an embodiment, each of the plurality of stacked chips 121-124 may be substantially similar to one another. In an embodiment, one or more of the plurality of stacked chips 121-124 may be different from the rest of the plurality of stacked chips 121-124.

The plurality of stacked chips 121-124 is configured to be stacked over the base chip 110. The base chip 110 may be an interposer substrate, a logic chip, or a controller chip. The plurality of stacked chips 121-124 may be packaged into single package, and as a single semiconductor apparatus. The base chip 110 is configured to be electrically coupled to an external host apparatus or to an external controller, and is configured to transfer signals between the plurality of stacked chips 121-124, and the external host apparatus or the external controller. The base chip 110 is configured to include a plurality of signal paths (not illustrated) therein to transfer a control signal to control of the operation of the plurality of stacked chips 121-124. The plurality of stacked chips 121-124 may be sequentially stacked over the base chip 110 through the bumps 140.

The base chip 110 is configured to output a control signal, such as for example, a command signal CMD, an address signal ADD, a clock signal CLK, a data signal DQ, and so forth, associated with the operation of the plurality of stacked chips 121-124. The command signal CMD, the address signal ADD, the clock signal CLK, and the data signal DQ may be transmitted to the plurality of stacked chips 121-124 through the Through-Vias 130 associated with each of the plurality of stacked chips 121-124. The plurality of stacked chips 121-124 are configured to perform an operation in response to a control signal received through the Through-Vias 130.

Figure 2:
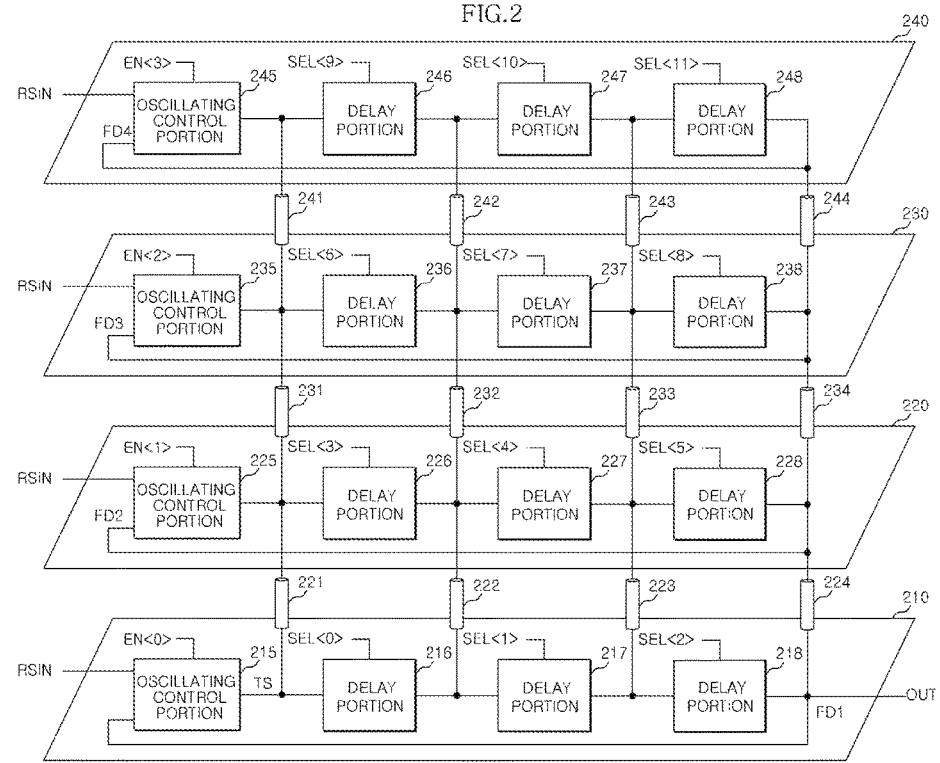
FIG. 2 is a schematic block diagram representation of an embodiment of a semiconductor apparatus.

FIG. 2 is a schematic block diagram representation of an embodiment of a semiconductor apparatus 2. The semiconductor apparatus 2 is configured to include first, second, third and fourth chips 210, 220, 230, 240. While FIG. 2 shows four chips 210, 220, 230, 240, alternative embodiments may include a fewer or greater number of chips. In an embodiment, the first, second, third and fourth chips 210, 220, 230, 240 may be used as the plurality of stacked chips 121-124 described with reference to FIG. 1. In an embodiment, the first chip 210 may be the base chip 110 described above with reference to FIG. 1, and the second, third and fourth chips 220, 230, 240 may correspond to the plurality of stacked chips 121-124 described with reference to FIG. 1. Each of the first, second, third and fourth chips 210, 220, 230, 240 is configured to include a plurality of Through-Vias for electrical coupling the chip to neighbouring chips. The second chip 220 is configured to include first, second, third and fourth Through-Vias 221-224, the third chip 230 is configured to include fifth, sixth, seventh and eighth Through-Vias 231-234, and the fourth chip 240 is configured to include ninth, tenth, eleventh, and twelfth Through-Vias 241-244. FIG. 2 does not show the Through-Vias included in the first chip 210. The first, fifth, and ninth Through Vias 221, 231, 241 are configured to be substantially vertically aligned, and configured to be electrically coupled to each other. The second, sixth, and tenth Through Vias 222, 232, 242 are configured to be substantially vertically aligned, and configured to be electrically coupled to each other. The third, seventh, and eleventh Through Vias 223, 233, 243 are configured to be substantially vertically aligned, and configured to be electrically coupled to each other. The fourth, eighth, and twelfth Through Vias 224, 234, 244 are configured to be substantially vertically aligned, and configured to be electrically coupled to each other.

Each of the first, second, third and fourth chips 210, 220, 230, 240 is configured to include a ring oscillator. The ring oscillator is configured to include an oscillating control portion 215, 225, 235, 245, and a delay chain. The delay chain is configured to include a plurality of delay portions 216, 217, 218, 226, 227, 228, 236, 237, 238, 246, 247, 248. The first chip 210 is configured to include the first oscillating control portion 215, and the first, second and third delay portions 216, 217, 218. The first oscillating control portion 215 is configured to receive an input signal RSIN, and a first feedback signal FD1, and is configured to be electrically coupled to the first Through-Via 221. The first oscillating control portion 215 is configured to generate a transmission signal TS based on the input signal RSIN, and the first feedback signal FD1, and is configured to transmit the transmission signal TS to the first Through-Via 221. The first delay portion 216 is configured to be electrically coupled to the first oscillating control portion 215, the first Through-Via 221, and the second Through-Via 222. The second delay portion 217 is configured to be electrically coupled to the first delay portion 216, the second Through-Via 222, and the third Through-Via 223. The third delay portion 218 is configured to be electrically coupled to the second delay portion 217, the third Through-Via 223, and the fourth Through-Via 224. The first oscillating control portion 215 is configured to be electrically coupled to the fourth Through-Via 224, and is configured to receive the first feedback signal FD1 through the fourth Through-Via 224.

The second chip 220 is configured to include the second oscillating control portion 225, and the fourth, fifth and sixth delay portions 226, 227, 228. The second oscillating control portion 225 is configured to receive the input signal RSIN, and a second feedback signal FD2, and is configured to be electrically coupled to the first Through-Via 221 and the fifth Through-Via 231. The fourth delay portion 226 is configured to be electrically coupled to the second oscillating control portion 225, the first Through-Via 221, the second Through-Via 222, the fifth Through-Via 231, and the sixth Through-Via 232. The fifth delay portion 227 is configured to be electrically coupled to the fourth delay portion 226, the second Through-Via 222, the third Through-Via 223, the sixth Through-Via 232, and the seventh Through-Via 233. The sixth delay portion 228 is configured to be electrically coupled to the fifth delay portion 227, the third Through-Via 223, the fourth Through-Via 224, the seventh Through-Via 233, and the eighth Through-Via 234.

The third chip 230 is configured to include the third oscillating control portion 235, and the seventh, eighth, and ninth delay portions 236, 237, 238. The third oscillating control portion 235 is configured to receive the input signal RSIN, and a third feedback signal FD3, and is configured to be electrically coupled to the fifth Through-Via 231 and the ninth Through-Via 241. The seventh delay portion 236 is configured to be electrically coupled to the third oscillating control portion 235, the fifth Through-Via 231, the sixth Through-Via 232, the ninth Through-Via 241, and the tenth Through-Via 242. The eighth delay portion 237 is configured to be electrically coupled to the seventh delay portion 236, the sixth Through-Via 232, the seventh Through-Via 233, the tenth Through-Via 242, and the eleventh Through-Via 243. The ninth delay portion 238 is configured to be electrically coupled to the eighth delay portion 237, the seventh Through-Via 233, the eighth Through-Via 234, the eleventh Through-Via 243, and the twelfth Through-Via 244.

The fourth chip 240 is configured to include the fourth oscillating control portion 245, and tenth, eleventh and twelfth delay portions 246, 247, 248. The fourth oscillating control portion 245 is configured to receive the input signal RSIN, and a fourth feedback signal FD4, and is configured to be electrically coupled to the ninth Through-Via 241. The tenth delay portion 246 is configured to be electrically coupled to the fourth oscillating control portion 245, the ninth Through-Via 241, and the tenth Through-Via 242. The eleventh delay portion 247 is configured to be electrically coupled to the tenth Through-Via 242, and the eleventh Through-Via 243. The twelfth delay portion 248 is configured to be electrically coupled to the eleventh Through-Via 243, and the twelfth Through-Via 244.

The first, second, third and fourth oscillating control portions 215, 225, 235, 245 are configured to be enabled in response to first, second, third and fourth enablement signals EN<0:3>, respectively. The first, second, third and fourth enablement signals EN<0:3> may be generated based on stacked chip information. Each of the first through twelfth delay portions 216, 217, 218, 226, 227, 228, 236, 237, 238, 246, 247, 248 are configured to be turned ON in response to an associated one of the first through twelfth selection signals SEL<0:11>. The first through twelfth selection signals SEL<0:11> may be generated based on the stacked chip information and path selection information. The semiconductor apparatus 2 is configured to select an oscillating path passing through one or more of the first to twelfth Through- Vias 221, 222, 223, 224, 231, 232, 233, 234, 241, 242, 243, 244 by enabling one of the first, second or third fourth enablement signals EN<0:3>, and by enabling one or more of the first through twelfth selection signals SEL<0:11>.

Figure 3:
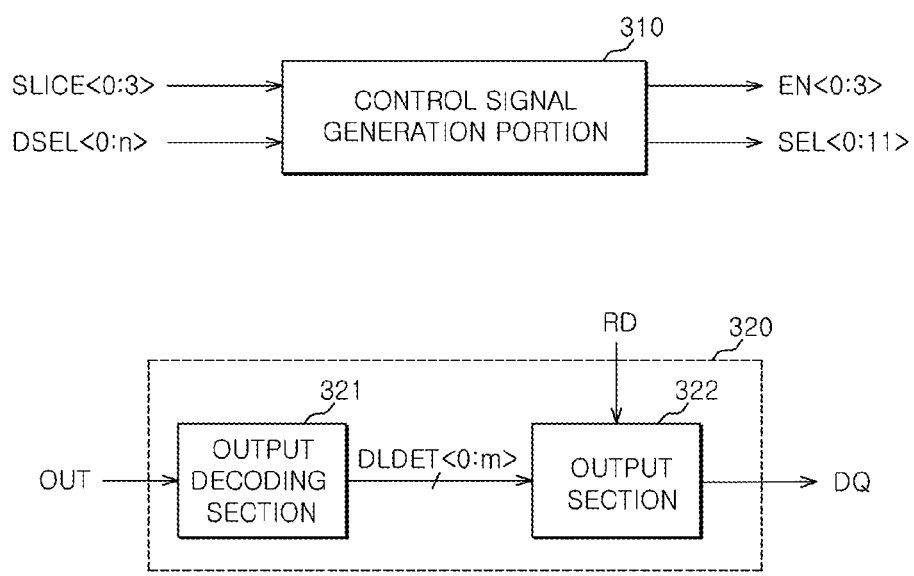
FIG. 3 is a block diagram representation of a control signal generation portion and an output monitoring portion of an embodiment of a semiconductor apparatus.

FIG. 3 is a block diagram representation of a control signal generation portion 310 and an output monitoring portion 320 of an embodiment of the semiconductor apparatus 2. The semiconductor apparatus 2 is configured to include the control signal generation portion 310, and the output monitoring portion 320. The control signal generation portion 310 is configured to generate the first, second, third and fourth enablement signals EN<0:3>, and the first through twelfth selection signals SEL<0:11> in response to stacked chip information SLICE<0:3>, and path selection information DSEL<0:n> (where n is a natural number). The stacked chip information SLICE<0:3> may be a 4-bit signal, where each bit corresponds an associated one of the four chips of the semiconductor apparatus 2. While the use of four chips and a 4 bit stacked chip information signal has been described, alternative embodiments may include a greater or fewer number of chips and/or bits in the stacked chip information signal. The control signal generation portion 310 is configured to include a decoding section for decoding the stacked chip information SLICE<0:3>, and the path selection information DSEL<0:n>. The control signal generation portion 310 may selectively enable and/or disable the first through twelfth selection signals SEL<0:11> based on the stacked chip information SLICE<0:3>, and the path selection information DSEL<0:n>.

The output monitoring portion 320 is configured to include an output decoding section 321, and an output section 322. The output decoding section 321 is configured to receive an output signal OUT, such as for example the first feedback signal FD1 through the fourth Through-Via 224, and is configured to generate a delay detection signal DLDET<0:m> (where m is a natural number). For example, the output decoding section 321 is configured to include a counting circuit configured to count a number of toggles of the first feedback signal FD1, and is configured to generate the delay detection signal DLDET<0:m> by decoding the counting result.

The output section 322 is configured to receive the delay detection signal DLDET<0:m>, and is configured to output the delay detection signal DLDET<0:m> as data DQ in response to a read command RD. The output section 322 is configured to use a path that the semiconductor apparatus 2 uses to output normal data. The semiconductor apparatus 2 does not include an additional circuit for outputting the delay detection signal DLDET<0:m>. The output decoding section 321 is configured to load the delay detection signal DLDET<0:m> on a data transmission line, and the output section 322 is configured to transmit the loaded delay detection signal DLDET<0:m> as data DQ in response to the read command RD. The delay detection signal DLDET<0:m> may be transmitted to an external device through a data pad included in the semiconductor apparatus 2, and may be monitored by an external apparatus electrically coupled to the semiconductor apparatus 2.

The output monitoring portion 320 is configured to detect the delay amount or the electrical characteristic of one or more of the first through twelfth delay portions 216, 217, 218, 226, 227, 228, 236, 237, 238, 246, 247, 248, and one or more of the first through twelfth Through-Vias 221, 222, 223, 224, 231, 232, 233, 234, 241, 242, 243, 244 by receiving a signal passing through the oscillating path electrically formed in the semiconductor apparatus 2.

The control signal generation portion 310, and the output monitoring portion 320 may be included in one of the first, second, third and fourth chips 210, 220, 230, 240. In an embodiment, the control signal generation portion 310, and the output monitoring portion 320 may be included in the first chip 210. The control signal generation portion 310, and the output monitoring portion 320 are configured to be included in each of the first, second, third and fourth chips 210, 220, 230, 240, and are configured to be disposed in the interposer substrate, the logic chip, the controller chip, the external host apparatus, or the external controller.

Figure 4:
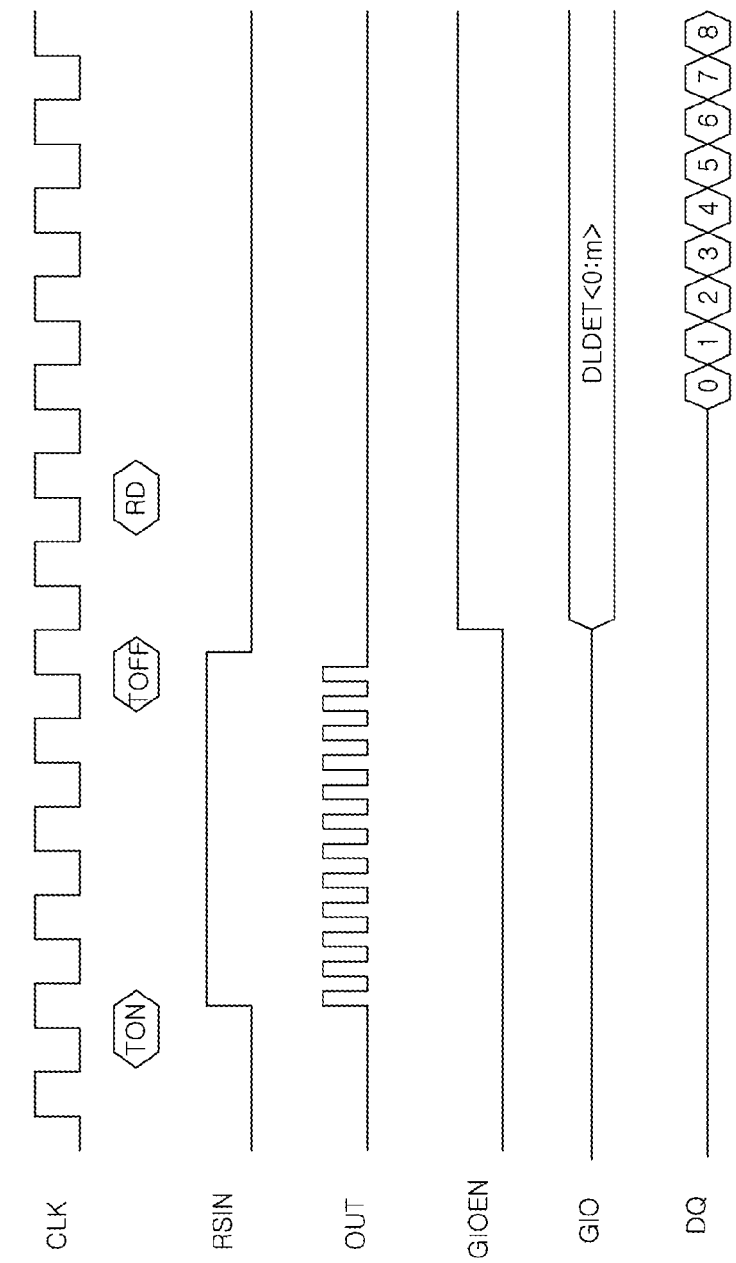
FIG. 4 is a timing diagram illustrating an operation of an embodiment of a semiconductor apparatus.

FIG. 4 is a timing diagram illustrating an operation of an embodiment of a semiconductor apparatus 2. An enablement command TON may be received at the semiconductor apparatus 2 to enable the monitoring of the characteristics of the Through-Vias in the semiconductor apparatus 2. When the enablement command TON is received at the semiconductor apparatus 2, the input signal RSIN may be enabled. Hereinafter, a case is described where the first enablement signal EN<0>, the second selection signal SEL<1>, the tenth selection signal SEL<9>, and the twelfth selection signal SEL<11> are enabled according to the stacked chip information SLICE<0:3> and the path selection information DSEL<0:n>. In this case, an oscillating path may be formed through all of the Through-Vias 221, 222, 223, 224, 231, 232, 233, 234, 241, 242, 243, 244 electrically coupling the first, second, third and fourth chips 210, 220, 230, 240.

When the input signal RSIN is enabled, an output signal OUT may be generated that oscillates with a period corresponding to the time it takes for a signal to be transmitted through all of the Through-Vias 221, 222, 223, 224, 231, 232, 233, 234, 241, 242, 243, 244 and the three numbers associated with the delay portions 217, 246, 248 of the semiconductor apparatus 2. The number of toggles of the output signal OUT may be stored as the delay detection signal DLDET<0:m> by the output decoding section 321. And then, when a disablement command TOFF is received at the semiconductor apparatus 2, the input signal RSIN may be disabled, and the generation of the output signal OUT may cease. When the disablement command TOFF is received at the semiconductor apparatus 2, a transmission enablement signal GIOEN may be enabled, and the delay detection signal DLDET<0:m> that is generated by the output decoding section 321, may be loaded on a data transmission line GIO. After that, when the read command RD is received at the semiconductor apparatus 2, the delay detection signal DLDET<0:m> that is loaded on the data transmission line GIO, may be transmitted as data DQ to a device external to the semiconductor apparatus 2 after a time piece corresponding to a read latency.

Figure 5:
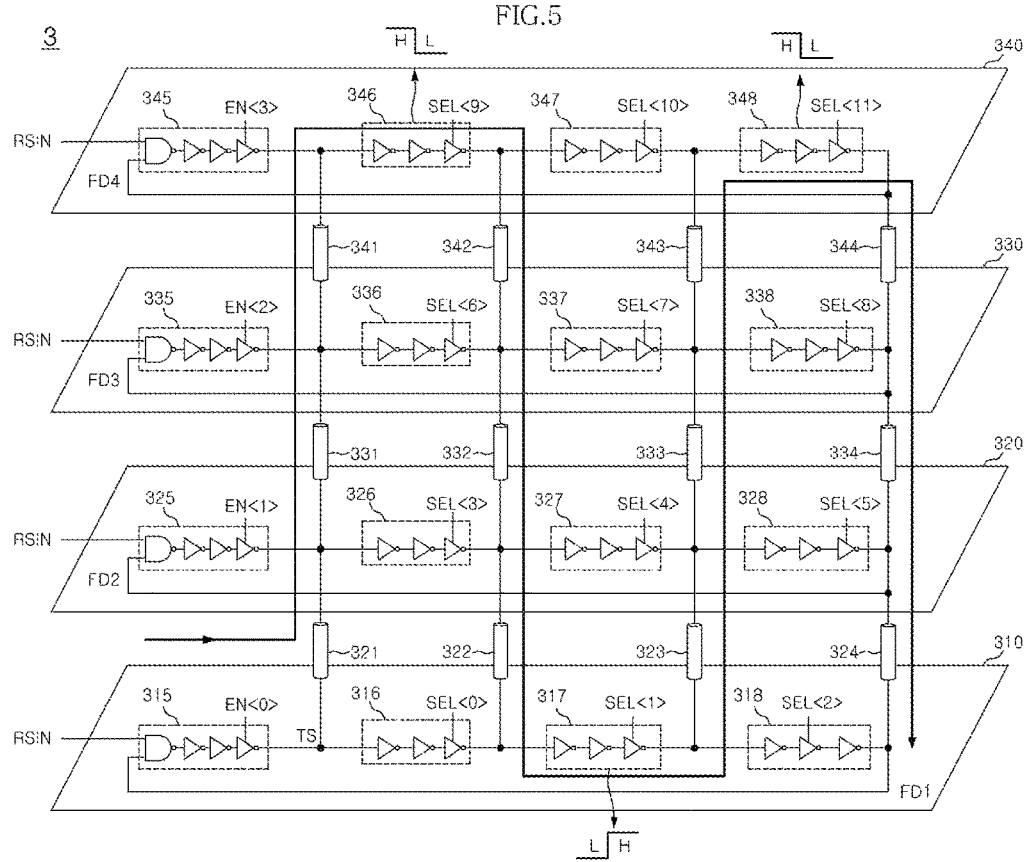
FIG. 5 is a schematic circuit diagram representation of an embodiment of a semiconductor apparatus.

FIG. 5 is a schematic circuit diagram representation of an embodiment of an embodiment of a semiconductor apparatus 3. The semiconductor apparatus 3 may monitor "Crosstalk" characteristics between neighboring Through-Vias that are configured to electrically couple the plurality of chips. The semiconductor apparatus 3 may be substantially similar to the semiconductor apparatus 2 described with reference to FIG. 4, and is configured to include first, second, third and fourth oscillating control portions 315, 325, 335, 345, and first through twelfth delay portions 316, 317, 318, 326, 327, 328, 336, 337, 338, 346, 347, 348. The first oscillating control portion 315 is configured to include a NAND gate, and an inverter chain. The inverter chain is turned ON in response to the first enablement signal EN<0>. The NAND gate is configured to receive the input signal RSIN, and the first feedback signal FD1. The inverter chain is configured to receive an output of the NAND gate, and to output the transmission signal TS. Substantially similar to the first oscillating control portion 315, each of the second, third and fourth oscillating control portions 325, 335, 345 is configured to include a NAND gate, and an inverter chain. The inverter chains of the second, third and fourth oscillating control portions 325, 335, 345 are configured to be turned ON in response to a corresponding one of the second, third and fourth enable signals EN<1:3>. The first delay portion 316 is configured to include an inverter chain that is turned ON in response to the first selection signal SEL<0>. Each of the second and third delay portions 317, 318 is configured to include an inverter chain that is turned ON in response to a corresponding one of the second and third selection signals SEL<1:2>. Each of the fourth through twelfth delay portions 326, 327, 328, 336, 337, 338, 346, 347, 348 is configured to include an inverter chain that is turned ON in response to a corresponding one of the fourth through twelfth selection signals SEL<3:11>.

The operation of the semiconductor apparatus 3 will be described with reference to FIG. 5. The control signal generation portion 310 that is described above with reference to FIG. 3 may be used to enable the first enable signal EN<0>, the second selection signal SEL<1>, the tenth selection signal SEL<9>, and the twelfth selection signal SEL<11> in response to the stacked chip information SLICE<0:3>, and the path selection information DSEL<0: n>. Therefore, the first oscillating control portion 315 may be enabled, the second delay portion 317, the tenth delay portion 346, and the twelfth delay portion 348 may be turned ON. The first oscillating control portion 315 may generate the transmission signal TS having a logic low level in response to the input signal RSIN having a logic high level, and the first feedback signal FD1 having a logic low level. The transmission signal TS may be received at the tenth delay portion 346 sequentially through the first Through-Via 321, the fifth Through-Via 331, and the ninth Through-Via 341 since the first delay portion 316, the fourth delay portion 326, and the seventh delay portion 336 are turned OFF. A signal transmitted by the tenth delay portion 346 may be received at the second delay portion 317 sequentially through the tenth Through-Via 342, the sixth Through-Via 332, and the second Through-Via 322 since the eleventh delay portion 347, the eighth delay portion 337, and the fifth delay portion 327 are turned OFF. A signal transmitted by the second delay portion 317 may be received at the twelfth delay portion 348 sequentially through the third Through-Via 323, the seventh Through-Via 333, and the eleventh Through-Via 343 since the third delay portion 318, the sixth delay portion 328, and the ninth delay portion 338 are turned OFF. A signal transmitted by the twelfth delay portion 348 may be transmitted sequentially through the twelfth Through-Via 344, the eighth Through-Via 334, and the fourth Through-Via 324. The signal transmitted through the fourth Through-Via 324 may be received as the first feedback signal FD1 at the NAND gate in the first oscillating control portion 315. As described above, the semiconductor apparatus 3 may select the oscillating path (illustrated with the bold line in FIG. 5) passing through all of the first through twelfth Through-Vias 321, 322, 323, 324, 331, 332, 333, 334, 341, 342, 343, 344. The first oscillating control portion 315 may generate the transmission signal TS having a logic high level in response to the first feedback signal FD1 having a logic high level. Therefore, the first feedback signal FD1 may be a oscillating signal with a period.

While the semiconductor apparatus 3 may, for example, select an oscillating path passing through all of the first through twelfth Through-Vias 321, 322, 323, 324, 331, 332, 333, 334, 341, 342, 343, 344 as described above, the semiconductor apparatus 3 may select different oscillating paths by selectively enabling the first, second, third and fourth oscillating control portions 315, 325, 335, 345, and individually turning ON or OFF the first through twelfth delay portions 316, 317, 318, 326, 327, 328, 336, 337, 338, 346, 347, 348. The semiconductor apparatus 3 may determine a reference chip from among the first, second, third and fourth chips 310, 320, 330, 340 by enabling one of the first, second, third and fourth enable signals EN<0:3> based on the stacked chip information SLICE<0:3>, and by enabling one of the first, second, third and fourth oscillating control portions 315, 325, 335, 345. The semiconductor apparatus 3 may select the oscillating path passing through two or more of the first through twelfth Through-Vias 321, 322, 323, 324, 331, 332, 333, 334, 341, 342, 343, 344 in two or more of the first, second, third and fourth chips 310, 320, 330, 340 by enabling two or more of the first through twelfth selection signals SEL<0:11> based on the stacked chip information SLICE<0:3>, and the path selection information DSEL<0: n>. The semiconductor apparatus 3 may monitor the characteristics of one of the first through twelfth Through-Vias 321, 322, 323, 324, 331, 332, 333, 334, 341, 342, 343, 344 by monitoring a signal transmitted through a oscillating path passing through the selected Through Via.

In an embodiment, each of the first through twelfth delay portions 316, 317, 318, 326, 327, 328, 336, 337, 338, 346, 347, 348 is configured to invert and output the received signals. As shown in FIG. 5, each of the first through twelfth delay portions 316, 317, 318, 326, 327, 328, 336, 337, 338, 346, 347, 348 may be an inverter chain including an odd numbers of inverters. The tenth delay portion 346 may invert a signal transmitted through the ninth Through-Via 341, and transmit the inverted signal to the tenth Through-Via 342. The second delay portion 317 may invert a signal transmitted through the second Through-Via 322, and transmit the inverted signal to the third Through-Via 323. The twelfth delay portion 348 may invert a signal transmitted through the eleventh Through-Via 343, and transmit the inverted signal to the twelfth Through-Via 344. Therefore, a signal transmitted sequentially through the first Through-Via 321, the fifth Through-Via 331, and the ninth Through-Via 341 may have a logic high level, and a signal transmitted sequentially through the tenth Through-Via 342, the sixth Through-Via 332, and the second Through-Via 322 may have a logic low level. Also, a signal transmitted sequentially through the third Through-Via 323, the seventh Through-Via 333, and the eleventh Through-Via 343 may have a logic high level, and a signal transmitted sequentially through the twelfth Through-Via 344, the eighth Through-Via 334, and the fourth Through-Via 324 may have a logic low level. As described above, the Through-Vias 321, 331, 341, 323, 333, 343 of first and third columns may transmit a signal having a logic high level, and the Through-Vias 322, 332, 342, 324, 334, 344 of second and fourth columns may transmit a signal having a logic low level, and the "Crosstalk" effect between the Through-Vias of neighboring columns may be monitored. A "column" may refer to the plurality of Through-Vias that are substantially vertically aligned. The semiconductor apparatus 3 may monitor interference relationships between neighboring Through-Vias in a number of different ways by transmitting signals having opposite levels through the Through-Vias of each column. The semiconductor apparatus 3 may monitor the "Crosstalk" characteristics with reference to disposition distance of the Through-Vias by selecting a neighboring Through-Vias of various distances.

Figure 6:
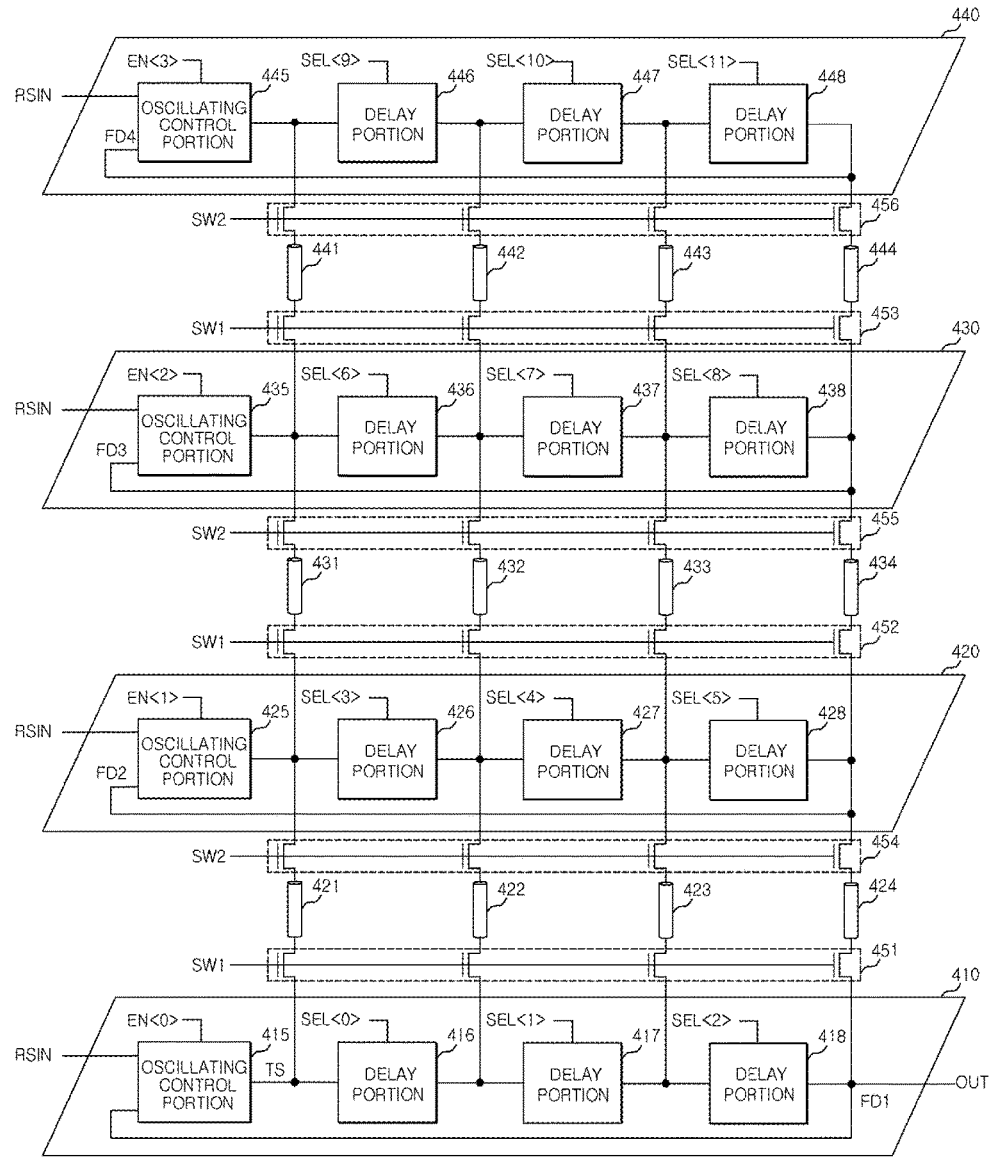
FIG. 6 is a schematic block diagram representation of an embodiment of a semiconductor apparatus.

FIG. 6 is a schematic block diagram illustrating a semiconductor apparatus 4 in accordance with an embodiment of the present invention. The semiconductor apparatus 4 may have substantially the same elements as the semiconductor apparatus 2 of FIG. 2. The substantially same elements are presented in FIG. 6 with similar reference numerals to those of the semiconductor apparatus 2 of FIG. 2. Hereinafter, description on the substantially same elements as the semiconductor apparatus 2 of FIG. 2 will be omitted. The semiconductor apparatus 4 may further include a plurality of switching portions with reference to the semiconductor apparatus 2 of FIG. 2. The semiconductor apparatus 4 including the plurality of switching portions may monitor more precisely the characteristics of the Through-Vias included in the semiconductor apparatus 4.

The semiconductor apparatus 4 may include a first switching portion 451, a second switching portion 452 and a third switching portion 453. The first switching portion 451 may electrically couple the first chip 410 and the second chip 420 based on a first switch control signal SW1. The first switching portion 451 may electrically couple the first chip 410 and the first to fourth Through-Vias 421, 422, 423, and 424 based on the first switch control signal SW1. The first switch control signal SW1 may be an arbitrary signal, and for example, may be a test mode signal. For example, the first switching portion 451 may electrically couple the first chip 410 and the first to fourth Through-Vias 421, 422, 423, and 424 when the first switch control signal SW1 is enabled, and may electrically de-couple the first chip 410 from the first to fourth Through-Vias 421, 422, 423, and 424 when the first switch control signal SW1 is disabled.

The second switching portion 452 may electrically couple the second chip 420 and the third chip 430 based on the first switch control signal SW1. The second switching portion 452 may electrically couple the second chip 420 and the fifth to eighth Through-Vias 431, 432, 433, and 434 based on the first switch control signal SW1. For example, the second switching portion 452 may electrically couple the second chip 420 and the fifth to eighth Through-Vias 431, 432, 433, and 434 when the first switch control signal SW1 is enabled, and may electrically de-couple the second chip 420 from the fifth to eighth Through-Vias 431, 432, 433, and 434 when the first switch control signal SW1 is disabled. The third switching portion 453 may electrically couple the third chip 430 and the fourth chip 440 based on the first switch control signal SW1. The third switching portion 453 may electrically couple the third chip 430 and the ninth to twelfth Through-Vias 441, 442, 443, and 444 based on the first switch control signal SW1. For example, the third switching portion 453 may electrically couple the third chip 430 and the ninth to twelfth Through-Vias 441, 442, 443, and 444 when the first switch control signal SW1 is enabled, and may electrically de-couple the third chip 430 from the ninth to twelfth Through-Vias 441, 442, 443, and 444 when the first switch control signal SW1 is disabled. Each of the first to third switching portions 451, 452, and 453 may include a plurality of transistors. Each of the plurality of transistors may receive the first switch control signal SW1 at its gate, and may be coupled to the respective Through-Vias 421, 422, 423, 424, 431, 432, 433, 434, 441, 442, 443, and 444 and the respective delay portions 416, 417, 418, 426, 427, 428, 436, 437, and 438 at its drain and source, respectively.

The semiconductor apparatus 4 may further include a fourth switching portion 454, a fifth switching portion 455 and a sixth switching portion 456. The fourth switching portion 454 may electrically couple the second chip 420 and the first to fourth Through-Vias 421, 422, 423, and 424 based on the second switch control signal SW2. For example, the fourth switching portion 454 may electrically couple the second chip 420 and the first to fourth Through-Vias 421, 422, 423, and 424 when the second switch control signal SW2 is enabled, and may electrically de-couple the second chip 420 from the first to fourth Through-Vias 421, 422, 423, and 424 when the second switch control signal SW2 is disabled. The fifth switching portion 455 may electrically couple the third chip 430 and the fifth to eighth Through-Vias 431, 432, 433, and 434 based on the second switch control signal SW2. For example, the fifth switching portion 455 may electrically couple the third chip 430 and the fifth to eighth Through-Vias 431, 432, 433, and 434 when the second switch control signal SW2 is enabled, and may electrically de-couple the third chip 430 from the fifth to eighth Through-Vias 431, 432, 433, and 434 when the second switch control signal SW2 is disabled. The sixth switching portion 456 may electrically couple the fourth chip 440 and the ninth to twelfth Through-Vias 441, 442, 443, and 444 based on the second switch control signal SW2. For example, the sixth switching portion 456 may electrically couple the fourth chip 440 and the ninth to twelfth Through-Vias 441, 442, 443, and 444 when the second switch control signal SW2 is enabled, and may electrically de-couple the fourth chip 440 from the ninth to twelfth Through-Vias 441, 442, 443, and 444 when the second switch control signal SW2 is disabled. Each of the fourth to sixth switching portions 454, 455, and 456 may include a plurality of transistors. Each of the plurality of transistors may receive the second switch control signal SW2 at its gate, and may be coupled to the respective delay portions 426, 427, 428, 436, 437, 438, 446, 447, and 448 and the respective Through-Vias 421, 422, 423, 424, 431, 432, 433, 434, 441, 442, 443, and 444 at its drain and source, respectively.

Hereinafter, the operation and the monitoring method of the semiconductor apparatus 4 in accordance with an embodiment of the present disclosure will be described below with reference to FIG. 6. When the first switch control signal SW1 is enabled, each of the first to fourth chips 410, 420, 430, and 440 may be electrically coupled to the first to twelfth Through-Vias 421, 422, 423, 424, 431, 432, 433, 434, 441, 442, 443, and 444 through the first to third switching portions 451, 452, and 453. In order to form an oscillating path, the first enablement signal EN<0> may be enabled among the first to fourth enablement signals EN<0: 3> and the fourth to sixth selection signals SEL<3:5> may be enabled among first to twelfth selection signals SEL<0: 11>. The first chip 410 may be a reference chip, and the oscillating control portion 415 may generate the transmission signal TS based on the input signal RSIN. Further, the first to third delay portions 416, 417, and 418, the seventh to ninth delay portions 436, 437, and 438, and the tenth to twelfth delay portions 446, 447, and 448 may be turned off, and the fourth to sixth delay portions 426, 427, and 428 may be turned on. Therefore, an oscillating path may be formed to sequentially run through the first Through-Via 421, the fourth delay portion 426, the fifth delay portion 427, the sixth delay portion 428, and the fourth Through-Via 424. The oscillating control portion 415 may receive the feedback signal FD1 through the fourth Through-Via 424, and may monitor a delay time of the oscillating path based on the feedback signal FD1.

Then, when the first switch control signal SW1 is disabled, the first to third switching portions 451, 452, and 453 may be turned off and the respective first to fourth chips 410, 420, 430, and 440 may be electrically de-coupled from the first to twelfth Through-Vias 421, 422, 423, 424, 431, 432, 433, 434, 441, 442, 443, and 444. At this time, the first enablement signal EN<0> and the first to third selection signals SEL<0:2> may be enabled. Therefore, the oscillating control portion 415 may provide the first delay portion 416 with the transmission signal TS and may receive the feedback signal FD1 from the third delay portion 418. The oscillating control portion 415 may monitor a delay time of the first to third delay portions 416, 417, and 418 based on the feedback signal FD1. Because the first to third delay portions 416, 417, and 418 may have the same structure and delay characteristics as the fourth to sixth delay portions 426, 427, and 428, the seventh to ninth delay portions 436, 437, and 438, and the tenth to twelfth delay portions 446, 447, and 448, the delay time of the first to third delay portions 416, 417, and 418 may be a reference delay time for the fourth to twelfth delay portions 426, 427, 428, 436, 437, 438, 446, 447, and 448. Therefore, a delay time by the first and fourth Through-Vias 421 and 424 may be measured by subtracting the delay time of the first to third delay portions 416, 417, and 418 from the delay time of the oscillating path, and thus characteristics of the first and fourth Through-Vias 421 and 424 may be monitored.

In an embodiment, after the monitoring of the delay time of the oscillating path, the second enablement signal EN<1> and the fourth to sixth selection signals SEL<3:5> may be enabled. Therefore, the oscillating control portion 425 may provide the fourth delay portion 426 with the transmission signal TS, and may receive the feedback signal FD2 from the sixth delay portion 428. The oscillating control portion 425 may monitor a delay time of the fourth to sixth delay portions 426, 427, and 428 based on the feedback signal FD2. At this time, when the second switch control signal SW2 is disabled, the second chip 420 may be electrically de-coupled from the first to third Through-Vias 421, 422, and 423. Therefore, a delay time of the fourth to sixth delay portions 426, 427, and 428 may be precisely measured regardless of loading of the first to third Through-Vias 421, 422, and 423. Accordingly, a delay time by the first and fourth Through-Vias 421 and 424 may be measured by subtracting the delay time of the fourth to sixth delay portions 426, 427, and 428 from the delay time of the oscillating path. Although a monitoring method for a particular Through-Via is exemplified so far, it will be understood to those skilled in the art that characteristics of any Through-Via may be monitored by various ways through the spirit and scope of the present disclosure.

Further, although not illustrated, the semiconductor apparatus 4 may further include Through-Vias for electrically coupling each of the oscillating control portions 415, 425, 435, and 445. When the first to sixth switching portions 451, 452, 453, 454, 455, and 456 are electrically blocked, a delay time of the respective first to twelfth delay portions 416, 417, 418, 426, 427, 428, 436, 437, 438, 446, 447, and 448 may be monitored through an oscillating path formed to the respective first to fourth chips 410, 420, 430, and 440. The delay time of the respective first to twelfth delay portions 416, 417, 418, 426, 427, 428, 436, 437, 438, 446, 447, and 448 may be provided to the reference chip through a Through-Via coupling the oscillating control portions 415, 425, 435, and 445. The reference chip may measure a delay time by a Through-Via by subtracting a delay time of a delay portion included in an oscillating path from a delay time of the oscillating path including the Through-Via.

While certain embodiments have been described above, it will be understood to those skilled in the art that the embodiments described are by way of example only. Accordingly, the stacked semiconductor apparatus being connected through through-via and monitoring method should not be limited based on the described embodiments. Rather, the stacked semiconductor apparatus being connected through through-via and monitoring method described herein should only be limited in light of the claims that follow when taken in conjunction with the above description and accompanying drawings.

What is claimed is:

1. A semiconductor apparatus comprising:
   an oscillating control portion disposed in a first chip, and configured to generate a transmission signal by receiving an input signal and a feedback signal;
   first and second Through-Vias configured to electrically couple the first chip and a second chip;
   a first delay portion disposed in the first chip, and coupled to the first and second Through-Vias;
   a second delay portion disposed in the second chip, and coupled to the first and second Through-Vias; and
   a first switching portion configured to electrically couple the first chip to the first and second Through-Vias based on a first switch control signal,
   wherein the oscillating control portion transmits the transmission signal to one of the first Through-Via and the first delay portion, and
   wherein the oscillating control portion receives the feedback signal through the second Through-Via when the first switching portion electrically couples the first chip to the first and second Through-Vias, and the oscillating control portion receives the feedback signal from the first delay portion when the first switching portion electrically de-couples the first chip to the first and second Through-Vias.

2. The semiconductor apparatus of claim 1, wherein, when the first switching portion electrically couples the first chip to the first and second Through-Vias, the oscillating portion transmits the transmission signal to the first Through-Via and receives the feedback signal from the second Through-Via.

3. The semiconductor apparatus of claim 1, wherein, when the first switching portion electrically de-couples the first chip from the first and second Through-Vias, the oscillating control portion transmits the transmission signal to the first delay portion and receives the feedback signal from the first delay portion.

4. The semiconductor apparatus of claim 1, further comprising a second switching portion configured to electrically couple the second chip to the first and second Through-Vias based on a second switch control signal.

5. The semiconductor apparatus of claim 1, wherein the first and second delay portions are turned on respectively based on first and second selection signals, which are generated on the basis of a stacked chip information and a path selection information.

6. The semiconductor apparatus of claim 5, wherein, when the first switching portion electrically couples the first chip to the first and second Through-Vias, the first delay portion is turned off in response to the first selection signal and the second delay portion is turned on in response to the second selection signal.

7. The semiconductor apparatus of claim 1, further comprising:
   a third Through-Via configured to electrically couple the first chip to the second chip;
   a third delay portion disposed in the first chip, and coupled to the first delay portion, the second Through-Via, and the third Through-Via; and a fourth delay portion disposed in the second chip, and coupled to the second delay portion, the second Through-Via, and the third Through-Via.

8. The semiconductor apparatus of claim 7, wherein the first switching portion electrically couples the first chip to the first to third Through-Vias based on the first switch control signal.

9. The semiconductor apparatus of claim 8, wherein, when the first switching portion electrically couples the first chip to the first to third Through-Vias, the oscillating control portion transmits the transmission signal to the first Through-Via and receives the feedback signal from the third Through-Via.

10. The semiconductor apparatus of claim 8, wherein, when the first switching portion electrically de-couples the first chip from the first to third Through-Vias, the oscillating control portion transmits the transmission signal to the first delay portion and receives the feedback signal from the third delay portion.

11. The semiconductor apparatus of claim 7, wherein the first to fourth delay portions are turned on respectively based on first to fourth selection signals, which are generated on the basis of a stacked chip information and a path selection information.

12. The semiconductor apparatus of claim 8, further comprising a second switching portion configured to electrically couple the second chip to the first to third Through-Vias based on a second switch control signal.

* * * * *